United States Patent [19]

Lee et al.

[11] 4,099,072
[45] Jul. 4, 1978

[54] VARIABLE PULSE WIDTH CIRCUIT

[75] Inventors: J. Spencer Lee, Santa Barbara; Leon E. Stoddard, Goleta, both of Calif.

[73] Assignee: Hughes Aircraft Company, Culver City, Calif.

[21] Appl. No.: 766,651

[22] Filed: Feb. 8, 1977

[51] Int. Cl.² ............................................. H03K 1/18
[52] U.S. Cl. ..................... 307/265; 307/246; 307/270; 307/294
[58] Field of Search ............... 307/234, 241, 246, 294, 307/265, 270; 328/111, 112, 143, 185

[56] References Cited
U.S. PATENT DOCUMENTS

| | | | |
|---|---|---|---|
| 3,226,578 | 12/1965 | Bengston | 328/143 X |
| 3,284,791 | 11/1966 | Voigt et al. | 307/246 X |
| 3,548,318 | 12/1970 | Yorksie | 307/294 X |
| 3,602,801 | 8/1971 | Williamson | 307/234 X |
| 3,665,216 | 5/1972 | Fuchie | 307/234 |

*Primary Examiner*—John S. Heyman
*Attorney, Agent, or Firm*—Martin E. Gerry; W. H. MacAllister

[57] ABSTRACT

A variable pulse width circuit comprising a semiconductor switch and a circuit of a pair of capacitors in series with the switch. The capacitors have a rectifier joining one side of said capacitors. The capacitors are in series with the load and are connected to a charging circuit. Two current paths are provided to enable charge of such capacitors under conditions where wide and narrow pulse widths of load current are obtained. Also obtained are higher and lower amplitudes of voltage pulses from the charging circuit.

5 Claims, 2 Drawing Figures

VARIABLE PULSE WIDTH CIRCUIT

BACKGROUND OF THE INVENTION

This invention is in the field of variable pulse width generating devices.

The prior art, though showing variable pulse width sources, cannot obtain such variable pulse widths with simple switching circuit elements and capacitors, and no on-point art exists.

SUMMARY OF THE INVENTION

A variable pulse width circuit, comprises in combination a semiconductor switch, a first capacitor and a second capacitor in circuit with the switch. Such circuit includes a rectifier joining the first and second capacitors.

An isolation transformer is provided connected to the gating input of the switch. A first diode and a second diode is also provided. The first diode is electrically connected to the first capacitor and the second diode is electrically connected to the anode input of the switch.

An impedance, electrically connected in series with the first and second capacitors is provided. Such impedance may typically be a diode as used in laser applications, or a resitive, capacitive or inductive load or combinations thereof. A load switch is electrically connected of a junction to the rectifier and the first diode.

A gating circuit electrically connected to the input of the isolation transformer is part of external circuitry activating the inventive device. Likewise, a charging circuit electrically connected to the first and second diodes is also part of the external circuitry for device activation.

DETAILED DESCRIPTION

Figure 1:
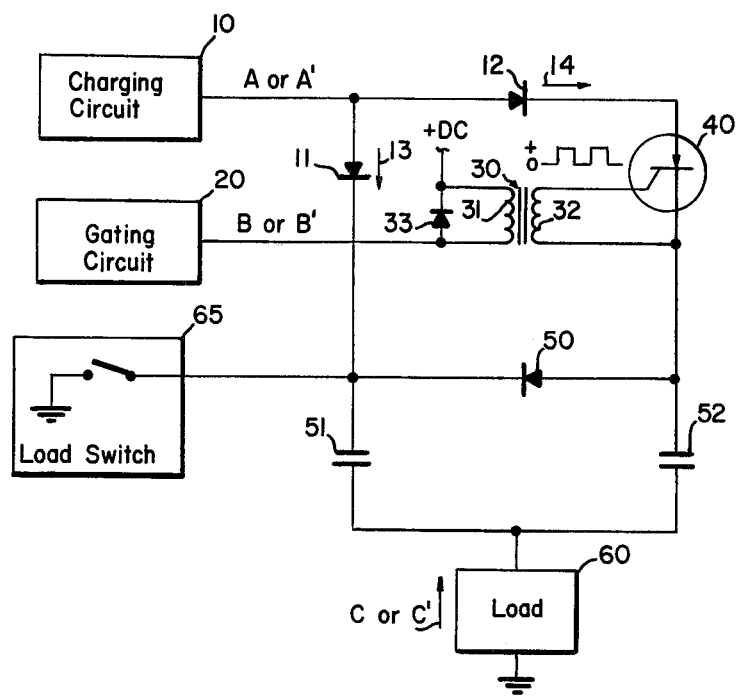
FIG. 1 is an electrical schematic circuit in accordance with the invention.
Figure 2:
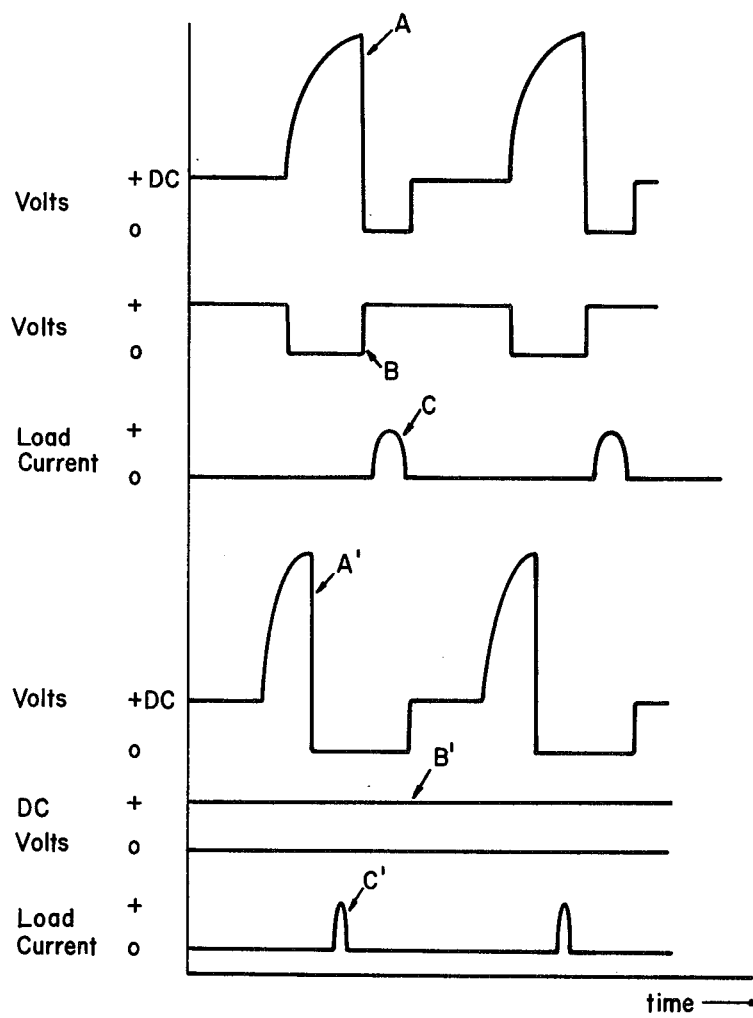
FIG. 2 is a waveform diagram of the several voltages and currents encountered in FIG. 1 showing a common time base between the several waveforms.

Referring to FIGS. 1 and 2, the inventive device provides short high current pulses of varied amplitude as at C or C', or voltage varied amplitudes as at A or A'. C or C' are ultimately to be provided to a laser diode or impedance at 60, as below described.

The feature of pulse width variation is accomplished by interposing switching device 40 which may be an SCR or a transistor, into the charging path of one of two capacitors 51 and 52 used to store pulse energy. When relatively short current pulses are desired, the switching device is non-conducting, allowing only capacitor 51 to charge and store energy. Discharge of this capacitor forms a relatively short current pulse in load 60 diode. For relatively long current pulses, the switching device is turned on, permitting both capacitors to charge and store energy. Simultaneous discharge of both capacitors creates a relatively long current pulse in the load.

Turn-on of the switch 40 is accomplished during capacitor charging by a current pulse applied at gate of switch 40 via an isolation transformer 30. Secondary 32 of transformer 30 is connected across the gate and the cathode of switch 40. Primary 31 of transformer 30 is connected to gating circuit 20 which provides waveforms as at B or B'.

Charging circuit at 10 provides voltage waveform outputs as at A or A'. Likewise gating circuit 20 will provide voltage waveform B or B'. Both circuits 10 and 20 are well known in the art.

Hence when waveforms A and B are present currents will flow through paths 13 and 14 so that current will also flow through diodes 11 and 12.

Current at 13 passing unidirectionally through diode 11 will charge capacitor 51 and capacitor 51 will accumulate said charge by well known principals of current integration.

Current at 14 will pass from anode to cathode of switch 40 when voltage as at B will provide positive potential to the gate of switch 40 to charge capacitor 52 in similar manner as capacitor 51 had been charged.

Capacitors 51 and 52 being fully charged will provide a current as at C though load 60 when load switch at 65 is closed. Load switch 65 is shown as a simple toggle switch but will be an externally triggered electronic control switch well known in the art, in actual practice. Rectifier 50 is connected across one of each of the sides of capacitors 51 and 52 and to load switch 65 so that the charge from capacitor 52 can be dumped through load 60 and switch 65. The charge from capacitor 51, under these circumstances will be dumped directly through load 60 and switch 65.

It is pointed out that charging circuit 10 provides both A and A' outputs in accordance with a mode selection device, well known in the art, provided by circuit 10. Likewise gating circuit 20 provides both B and B' outputs in accordance with a mode selection device, well known in the art, provided within circuit 20.

Accordingly, when circuits 10 and 20 provide waveforms A and B, the result appeared as current C, as above described. However, when waveform A' and B' are provided, only capacitor 51 will be charged, capacitor 52 being uncharged because no current will flow in path 14 through switch 40 because no gate voltage will be provided to the gate of switch 40 inasmuch as gating circuit 20 provides B' output which has no pulse present. Current path 13 providing current through diode 11 to charge capacitor 51 only will be inhibited by virtue the polarization of rectifier 50, current not flowing between cathode to anode of said rectifier, preventing charging of capacitor 52 by current in path 13.

Upon complete charging of capacitor 51 and subsequent execution of load switch 65, as above described, the charge of capacitor 51 only will be dumped through load 60 and switch 65 to create current pulse C' through load 60.

As a result, it can be seen that because of the charge of only one capacitor, for example capacitor 51, a narrow current pulse C' will result, as a consequence of narrow voltage pulse A'.

However, when both capacitors 51 and 52 are charged, a wider current pulse C will result. The basic reason for the wider current pulse is due to the combined effect of capacitor 51 and 52 in circuit with an inductive output of charging circuit 10.

Charging circuit 10 controls the amplitudes of waveform A and A' and as a consequence the amplitude of currents C and C' respectively.

It should be noted, that ordinarily switch 40 will be able to handle high voltages developed across its several electrodes. However, when the voltages are excessive, then diode 33 may be connected across primary 31 so that such high voltages will be thereby limited.

What is claimed is:

1. A dual charging mode network for feeding a load having an electronic switch, and first and second capacitors each having first and second terminals respectively, the first terminal of the second capacitor being connected to the electronic switch, said second terminals being joined to each other, and a rectifier bridging said first terminals, the improvement comprising:
- first means electrically coupled to the electronic switch and said first capacitor for providing charging currents to said capacitors;
- second means electrically coupled to the electronic switch for providing gating levels to the electronic switch thereby enabling the charging of at least one of said first and second capacitors during at least one of two modes of operation of said network;
- a load switch connected to the first terminal of the first capacitor; and
- an impedance connected to the second terminals of both of said capacitors.

2. The invention as stated in claim 1, wherein said first means includes:
- a charging circuit;
- a first diode connected between the charging circuit and the first capacitor and load switch; and
- a second diode connected between the charging circuit and the electronic switch.

3. The invention as stated in claim 2, wherein said first and second diodes and said electronic switch enables the charging of both the first and second capacitors.

4. The invention as stated in claim 1, wherein said second means includes a transformer connected to the electronic switch and a gating circuit feeding said transformer.

5. A dual mode variable pulse width and charging means for feeding a load, comprising the combination:
- a gating circuit for providing a DC output during a first mode of operation of the said means and for providing a variable pulse width output during a second mode of operation of said means;
- a semiconductor switch coupled to the gating circuit;
- first and second capacitors each having first and second terminals respectively, the first terminal of the second capacitor being connected to the switch and the second terminals being joined to each other;
- a rectifier bridging said first terminals;
- an impedance connected to both said second terminals;
- a load switch connected to the first terminal of the first capacitor; and
- a charging circuit electronically coupled to the semiconductor switch and the first terminal of the first capacitor.

* * * * *